United States Patent [19]

Nobel

[11] Patent Number: 5,796,417
[45] Date of Patent: *Aug. 18, 1998

[54] COMPLIANT INTERCONNECT ASSEMBLY FOR MOUNTING REMOVABLE PRINT CARTRIDGES IN A CARRIAGE

[75] Inventor: Gary M. Nobel, San Diego, Calif.

[73] Assignee: Hewlett-Packard Company, Palo Alto, Calif.

[*] Notice: The term of this patent shall not extend beyond the expiration date of Pat. No. 5,684,518.

[21] Appl. No.: 398,721

[22] Filed: Mar. 6, 1995

Related U.S. Application Data

[63] Continuation-in-part of Ser. No. 145,367, Oct. 29, 1993, Pat. No. 5,684,518.

[51] Int. Cl.⁶ .................................................. B41J 2/01
[52] U.S. Cl. .................................................. 347/50
[58] Field of Search .................. 347/49, 50; 439/67, 439/492

[56] References Cited

U.S. PATENT DOCUMENTS

| | | | |
|---|---|---|---|
| 4,124,878 | 11/1978 | Ebner et al. | 361/796 |
| 5,245,361 | 9/1993 | Kashimura et al. | 347/50 |
| 5,372,512 | 12/1994 | Wilson et al. | 439/67 |
| 5,684,518 | 11/1997 | Nobel et al. | 347/50 |

FOREIGN PATENT DOCUMENTS

| | | | |
|---|---|---|---|
| 0 546 544 A2 | 6/1993 | European Pat. Off. | B41J 2/175 |
| 0 602 020 A2 | 6/1994 | European Pat. Off. | B41J 25/34 |
| 0 622 208 A2 | 11/1994 | European Pat. Off. | B41J 2/175 |
| 0 622 233 A2 | 11/1994 | European Pat. Off. | B41J 25/34 |
| 0 622 235 A2 | 11/1994 | European Pat. Off. | B41J 25/34 |
| 0 622 866 A2 | 11/1994 | European Pat. Off. | H01J 9/07 |
| 0 650 848 A2 | 5/1995 | European Pat. Off. | B41J 25/34 |

*Primary Examiner*—N. Le
*Assistant Examiner*—L. Anderson
*Attorney, Agent, or Firm*—David S. Romney

[57] ABSTRACT

In a printer/plotter having a carriage for removably mounting one or more printhead cartridges, multiple pairs of aligned electrical interconnect pads provide signal transmission between printhead circuits and corresponding circuits on the carriage. A compliant foam material is positioned on the carriage to provide increased pressure for assuring conductivity across each interconnect pad junction. In a preferred embodiment, a thick block of compliant foam material having a flat upper surface is installed on the carriage for each printhead cartridge, and is positioned in an elongated rigid cavity of the carriage to push against the peripheral base portions of more than fifty dome-shaped copper interconnect pads which are densely packed on the flexible circuit.

24 Claims, 16 Drawing Sheets

COMPLIANT INTERCONNECT ASSEMBLY FOR MOUNTING REMOVABLE PRINT CARTRIDGES IN A CARRIAGE

RELATED APPLICATIONS

This application is a continuation-in-part of application Ser. No. 08/145,367 filed Oct. 29, 1993, now U.S. Pat. No. 5,684,518 in the name of Gary M. Nobel, et al. entitled INTERCONNECT SCHEME FOR MOUNTING DIFFERENTLY CONFIGURED PRINTHEADS ON THE SAME CARRIAGE, which application is assigned to the assignee of this application and is incorporated herein by reference.

BACKGROUND OF THE INVENTION

This invention relates generally to printers/plotters, and more specifically to print carriages having inkjet print cartridges removably mounted thereon.

It is common to have several inkjet print cartridges in a single carriage of an inkjet printer. But in some instances these cartridges may have different capabilities and therefore have different electrical interconnect designs connecting the cartridges to the printer. For example, the number and pattern of electrical contacts may differ between the different types of cartridges, such as in cartridges which have different print resolutions and/or different swath widths.

Typically in inkjet printers, one print cartridge is black and another is a tri-compartment color cartridge. Alternatively, a separate color cartridge is provided for each color component (e.g., cyan, magenta, yellow). The different types of nozzle arrays and differently designed color and black print cartridges, as well as other unique printhead characteristics all create the need for an inexpensive but reliable way to successfully mount such different cartridges into the same carriage.

A prior technique for assuring reliability of the interconnect pads is disclosed in U.S. Pat. No. 4,706,097 entitled NEAR-LINEAR SPRING CONNECT STRUCTURE FOR FLEXIBLE INTERCONNECT CIRCUITS. But that interconnect scheme requires a separate resilient cylinder to be positioned for alignment and contact with the central dome portion of each interconnect pad. Such a system is based on the precise positioning of each interconnect pad relative to each resilient cylinder. There is a need for a simpler and more reliable interconnect system, particularly as the number of interconnect pads increases, the interconnect pad density becomes greater, and where a plurality of ink-firing resistors are activated by each interconnect pad.

BRIEF SUMMARY OF THE INVENTION

An important aspect of the invention is to provide a reliable interconnect scheme for a carriage mounted flexible circuit member having an increased number of conductive pads closely spaced together over an enlarged area without having to change the size of the carriage chute for receiving a print cartridge. In that regard, the invention contemplates a simplified unitary resilient member made of foam or the like which assures pressurized interconnection of all of the increased number of conductive pads over their enlarged area.

More specifically, a typical printer/plotter has a carriage for removably mounting one or more printhead cartridges, with multiple pairs of aligned electrical interconnect pads providing signal transmission between printhead circuits and corresponding circuits on the carriage. A compliant foam material is positioned on the carriage to provide increased pressure for assuring conductivity across each interconnect pad junction. In a preferred embodiment, a thick block of compliant foam material having a flat upper surface is installed on the carriage for each printhead cartridge, and is positioned in an elongated rigid cavity of the carriage to push against the peripheral base portions of more than fifty dome-shaped copper interconnect pads which are densely packed on the flexible circuit.

The present invention provides an interconnect scheme which is easily adaptable to removably mounted print cartridges with different nozzle array densities which are activated through differently configured interconnect pad arrays.

In its preferred form, the invention provides a carriage having for reliably interconnecting through fifty-two interconnect pads in a six-column array a high resolution 600 dpi printhead having three-hundred nozzles arrayed in a ½ inch swath array.

DETAILED DESCRIPTION OF THE PREFERRED EMBODIMENT

In a multiple pen printer, it is important to improve the output quality of a printed page and increase the speed at which that output can be obtained as economically and simply as possible. In a printer mechanism, the output quality of a printed page is a function of printhead resolution. The higher the resolution the better the print quality. Also, in a swath printer employing a scanning carriage, the speed at which the output can be obtained is a function of the width of the swath which is covered by the printhead.

In current multi-pen printers, each pen has the same resolution and usually the same swath width. This means that all the supporting structure, mechanics and electronics needs to be scaled up to support the resolution of the entire set of pens. All this hardware is more expensive than the hardware to support a multi-resolution, multi-swath width pen set where one pen is at the higher resolution and larger width that is desired and the other pens in the set are at a lower resolution and smaller size.

This invention provides the benefits of a higher resolution, larger swath pen in lower resolution, smaller swath pens in the same printing machine. The higher performance pen can be used to improve output quality by enhancing certain key features that appear frequently in a printed page such as text. Such a pen also improves throughput by being able to print these frequent features faster. The other lower performance pens can be used for less frequent or less demanding features such as graphics.

In the presently preferred embodiment of the invention disclosed herein, we have combined a 600 dpi ½ inch swath black pen with three 300 dpi color pens each generating a swath of approximately ⅓ inch. The high performance black pen is typically used for printing text and other "black only" features, and thus the output quality and throughput of these features is greater. It also improves the output quality of color graphics and color features by teaming with the three lower performance color pens when printing color graphics or color features. The black component of the graphics which is often a large portion of color graphics content is at a higher resolution and thus at a higher output quality level. The larger swath can then be combined with printing algorithms to improve the throughput of color graphics.

Figure 1:
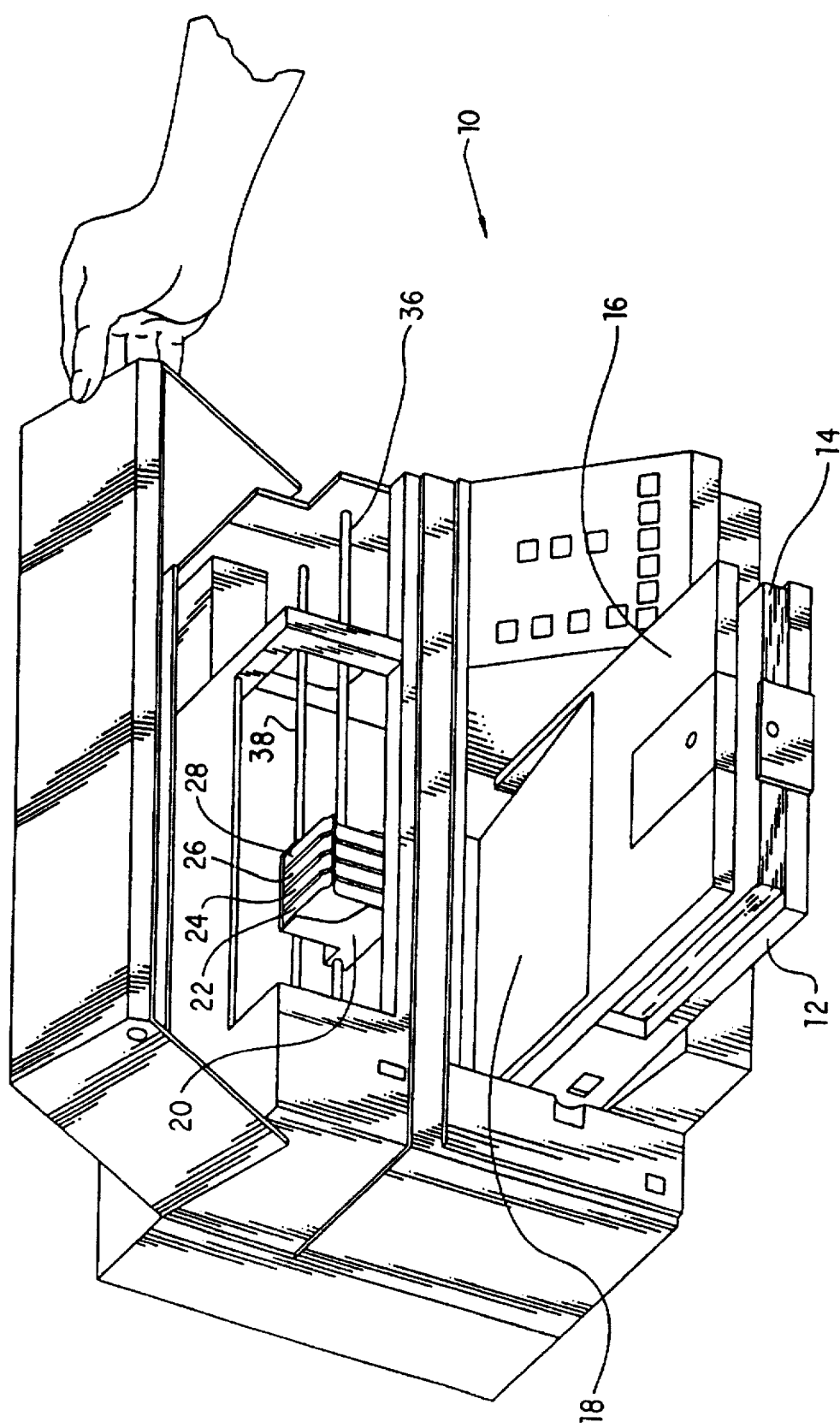
FIG. 1 shows a typical inkjet printer which can incorporate the apparatus and method of the present invention.
Figure 2:
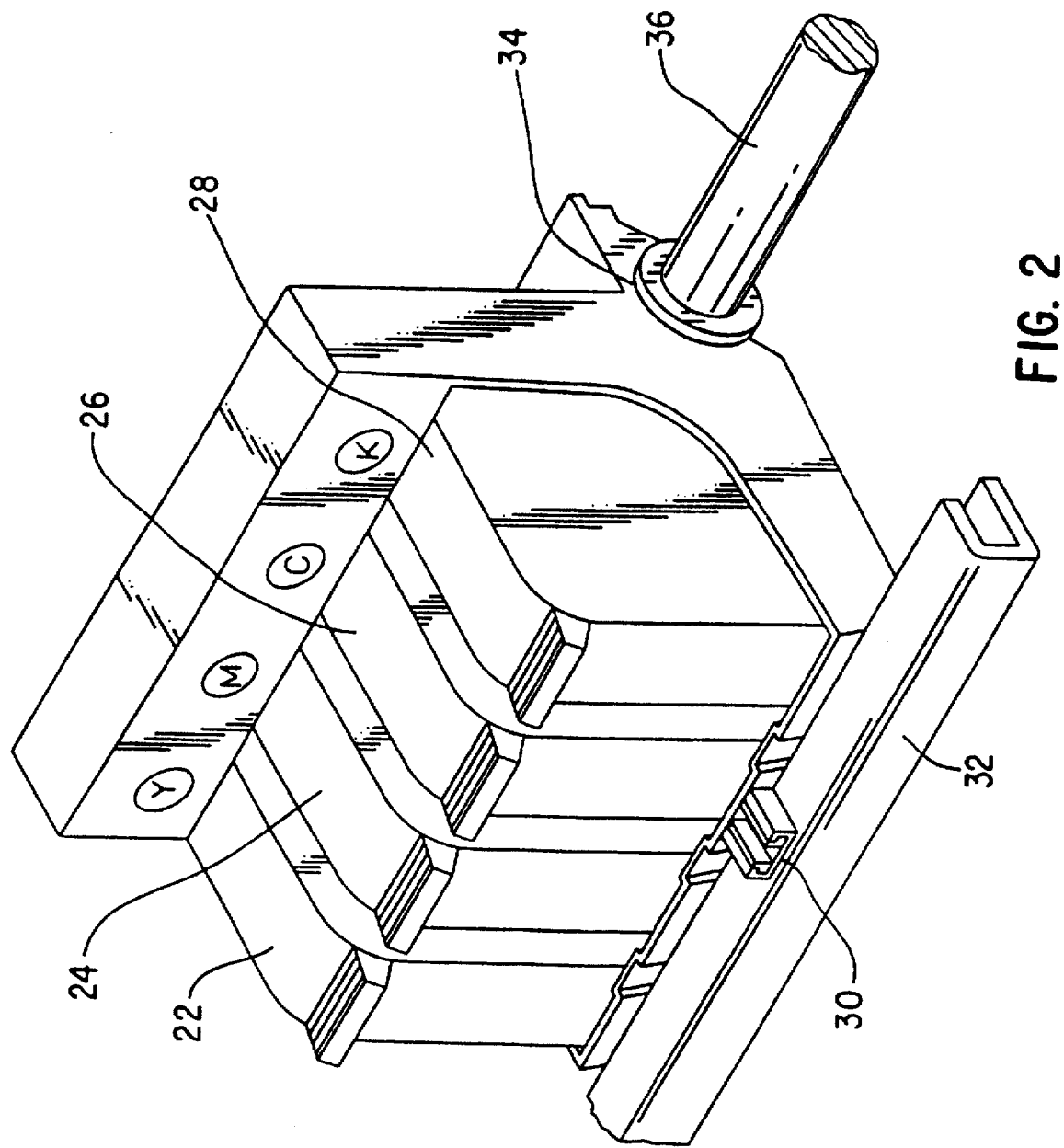
FIG. 2 shows a type of carriage having removable multicolor print cartridges, which can incorporate the resilient interconnect assembly and method of the present invention.
Figure 3:
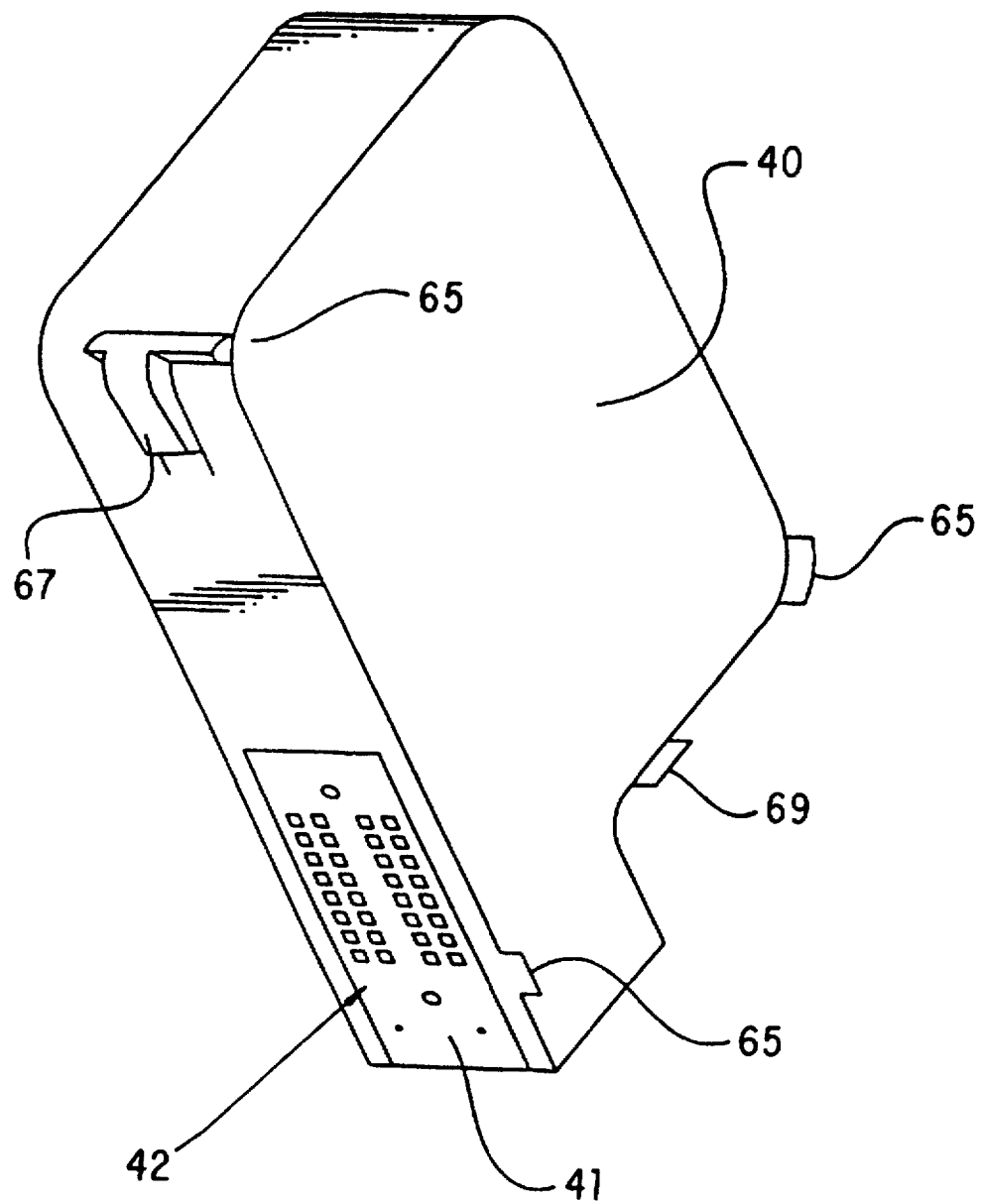
FIG. 3 shows an exemplary lower resolution color inkjet print cartridge of the type shown in FIG. 2.
Figure 4:
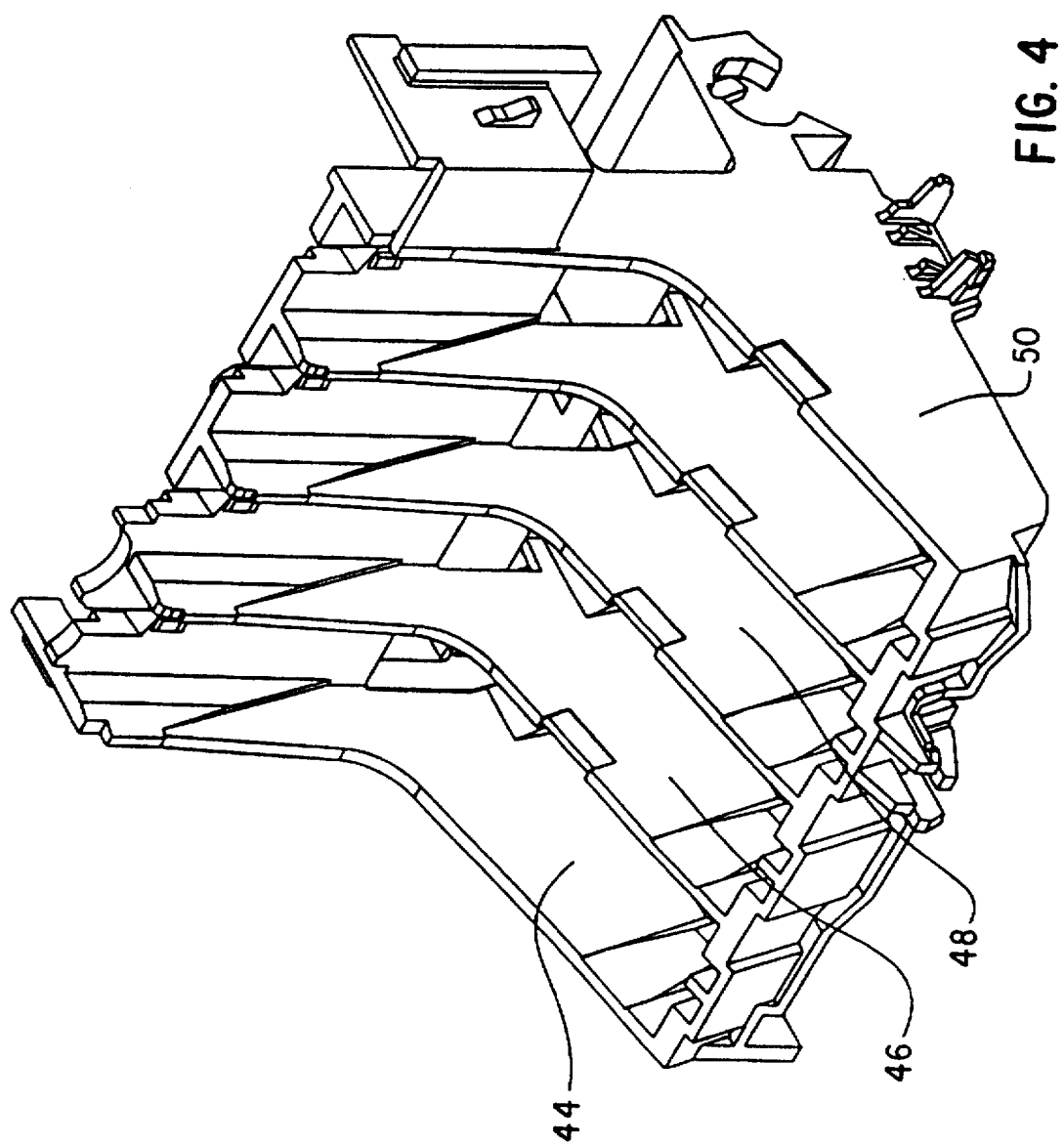
FIG. 4 is a perspective view of a presently preferred carriage embodiment.
Figure 5:
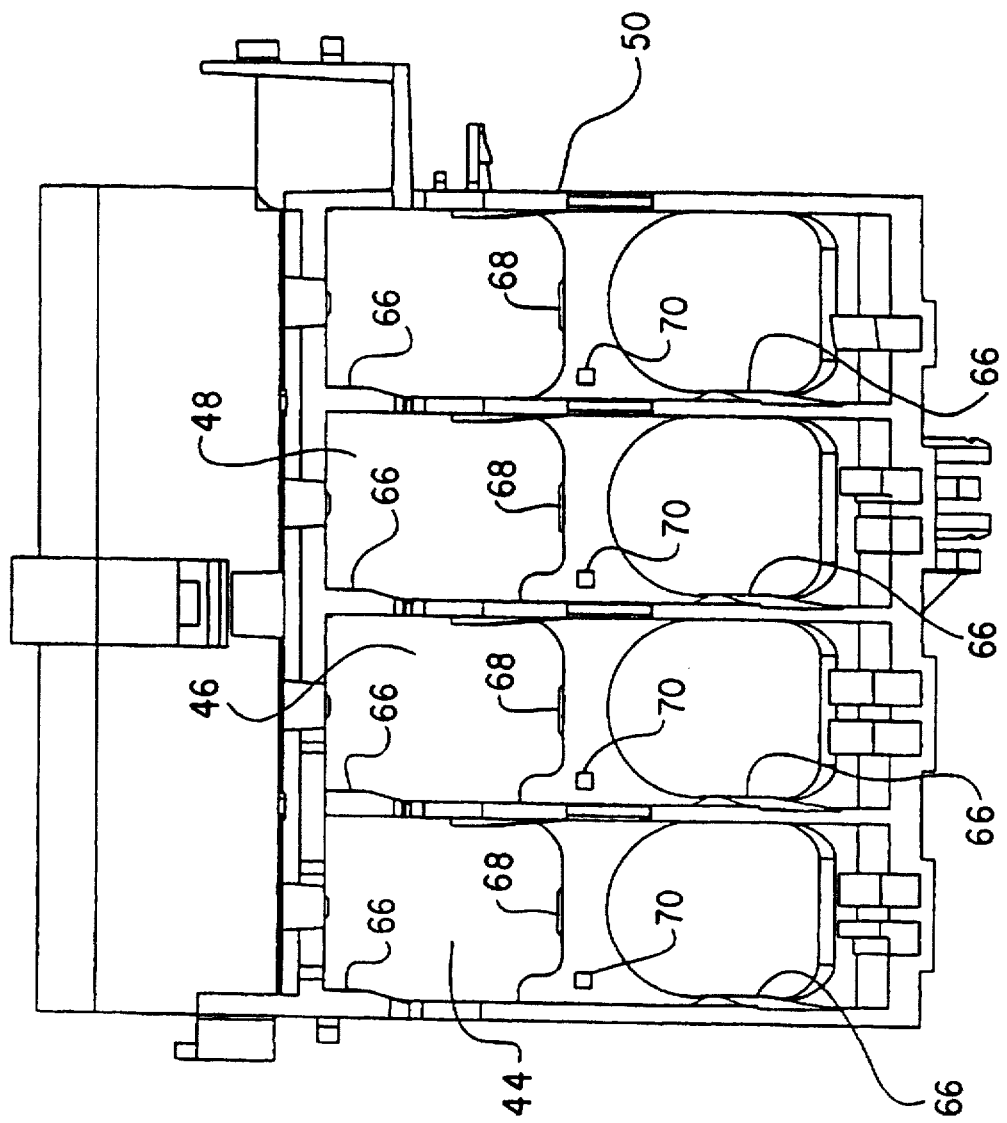
FIG. 5 is a top view of the carriage of FIG. 4.
Figure 6:
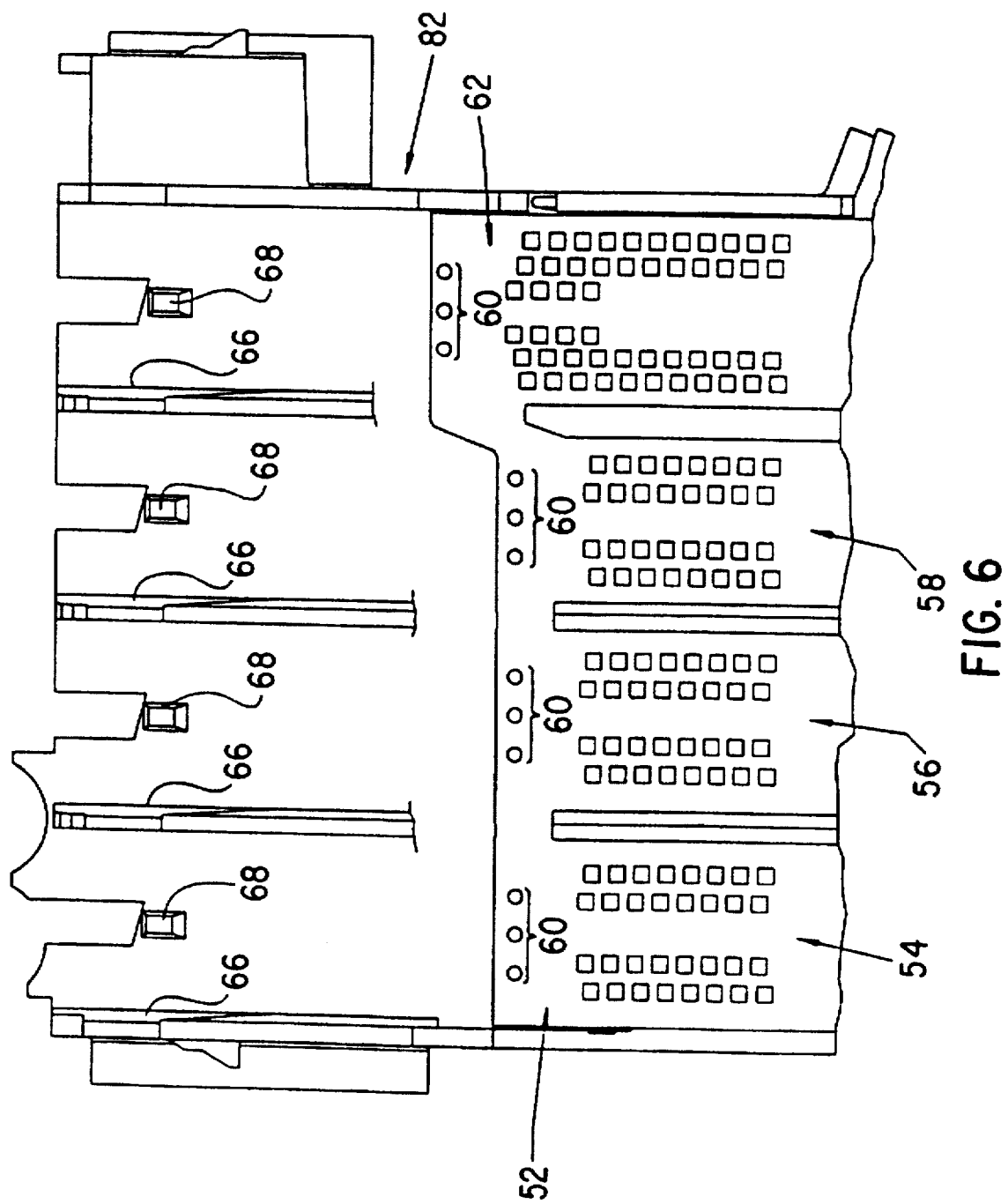
FIG. 6 is a fragmentary view of the flexible circuit interconnect on the carriage of FIGS. 4 and 5, with the interior carriage walls cut away.

Even though the invention can be used in any printing environment where text and/or graphics are applied to media using monochrome and/or color components including cyan, magenta, yellow, red, green, and blue, the presently preferred embodiment of the invention is used in an inkjet printer of the type shown in FIG. 1. In particular, inkjet printer 10 includes an input tray 12 containing sheets of media 14 which pass through a print zone, and are fed past an exit 18 into an output tray 16. Referring to FIGS. 1–2, a movable carriage 20 holds print cartridges 22, 24, 26, and 28 which respectively hold yellow (Y), magenta (M), cyan (C) and black (K) inks. The front of the carriage has a support bumper 30 which rides along a guide 32 while the back of the carriage has multiple bushings such as 34 which ride along slide rod 36. The position of the carriage as it traverses back and forth across the media is determined from an encoder strip 38 in order to be sure that the various ink nozzles on each print cartridge are selectively fired at the appropriate time during a carriage scan.

Referring to FIGS. 3–6, a 300 dpi color inkjet cartridge 40 having a tab-circuit 41 with a four column thirty-two pad electrical interconnect 42 is removably installed in three chutes 44, 46, 48 of a unitary carriage 50. A flex-circuit member 52 having three matching sets of conductive pads 54, 56, 58 is mounted on flex-frame pins 60 for operative engagement with the cartridge pads when the cartridge is inserted into its appropriate chute. An enlarged set of conductive pads 62 covering a larger area, having a different layout, and constituting an array of six columns totaling fifty-two conductive pads on the flex-circuit member is designed for operative engagement with cartridge pads on a 600 dpi black inkjet cartridge 64 (see FIG. 9).

The same X/Y/Z datum configuration is used for all of the printheads of the presently preferred embodiments. In that regard, the X-axis cartridge datums 65 engage the X-axis carriage datums 66, and the Y-axis cartridge datums 67 engage the Y-axis carriage datums 68, and the Z-axis cartridge datums 69 engage the Z-axis carriage datums 70.

Figure 9:
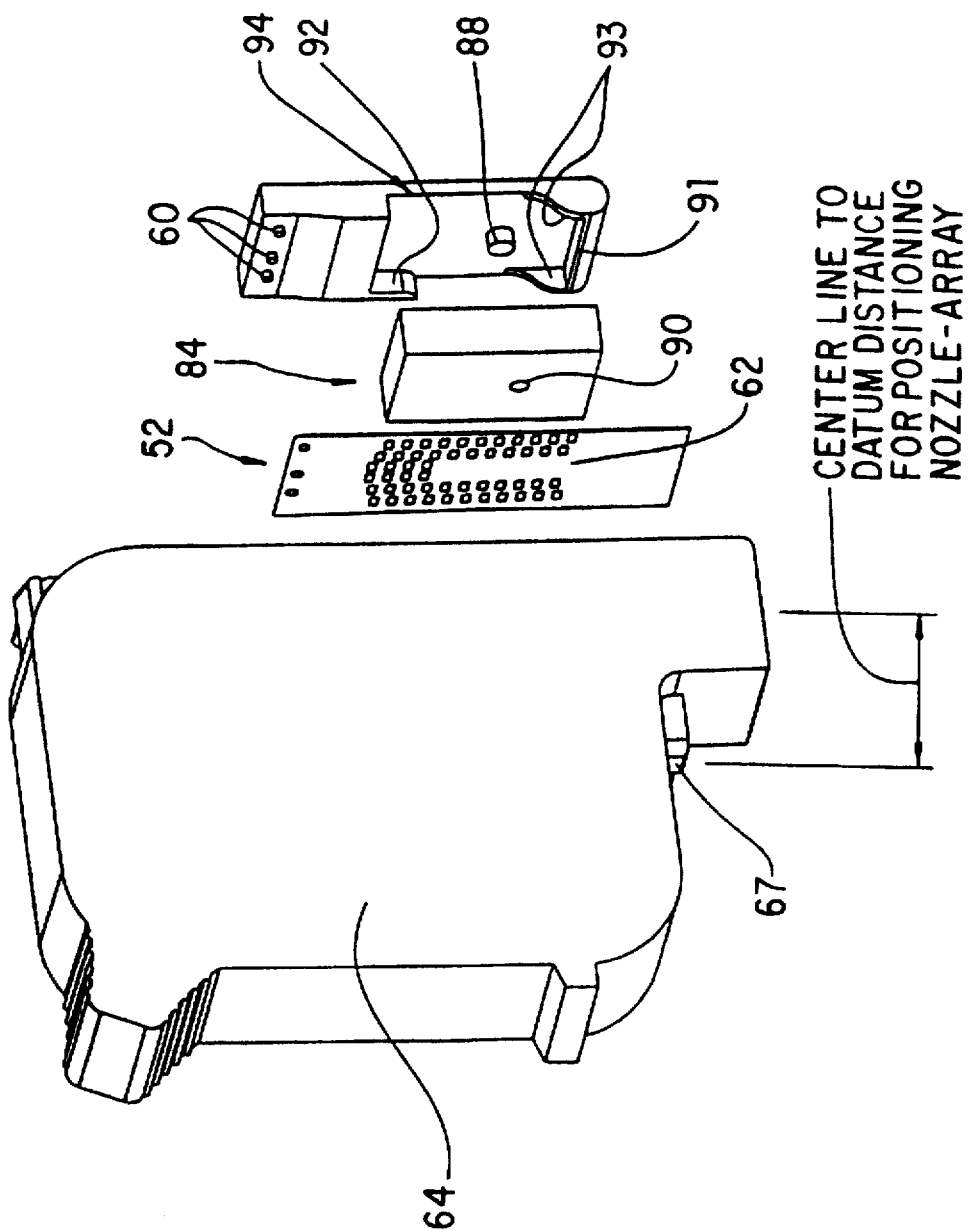
FIG. 9 is a schematic view showing an exemplary use of a compliant foam member for operatively connecting interconnect pads for a higher resolution black inkjet cartridge.
Figure 10:
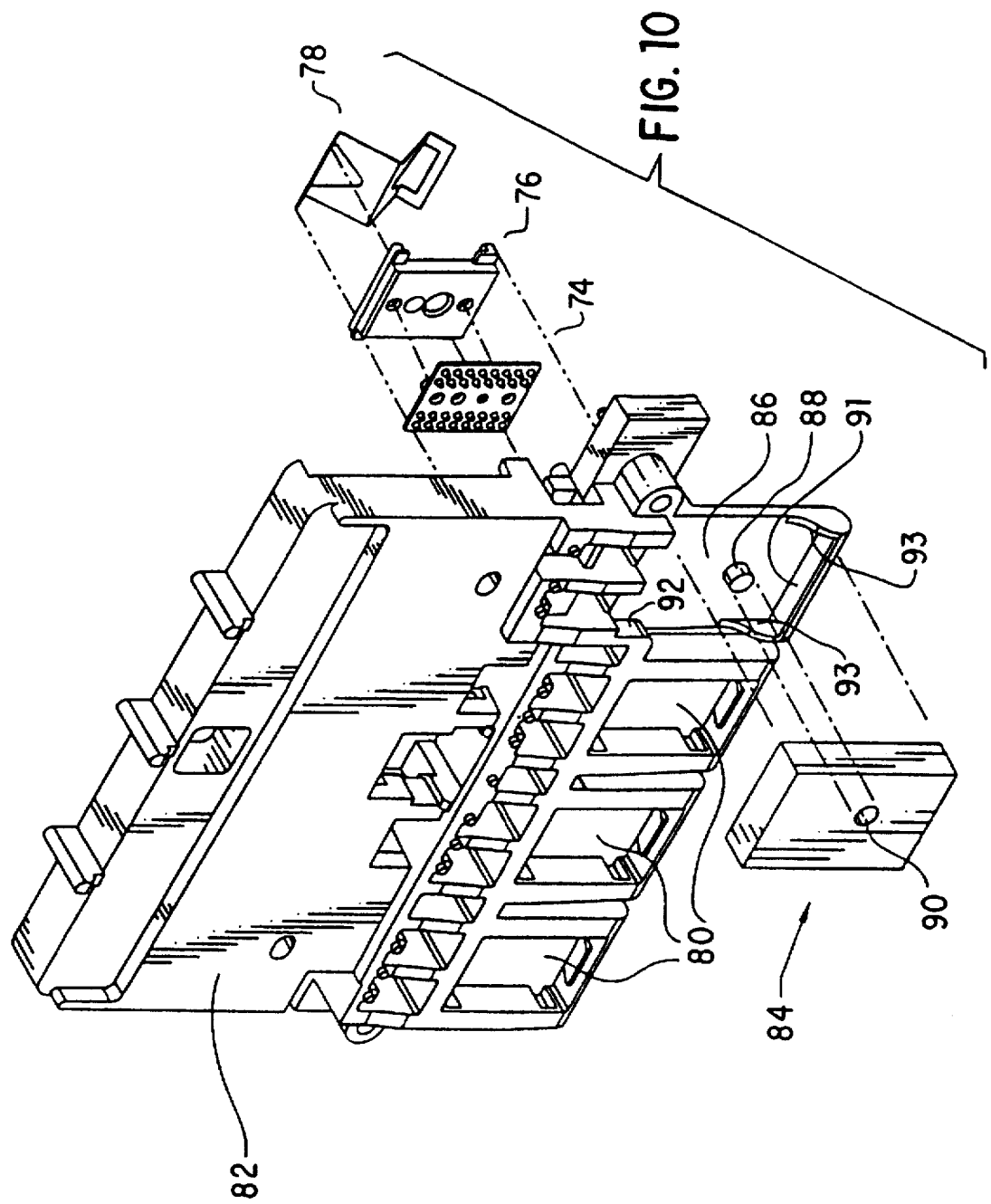
FIG. 10 is an exploded view showing a flex-circuit frame portion of a carriage, with the foam member of FIG. 9 for assuring reliable electrical interconnect to a higher resolution black inkjet cartridge, and a alternative metal spring member for assuring reliable electrical interconnect to a lower resolution color inkjet cartridge.
Figure 11:
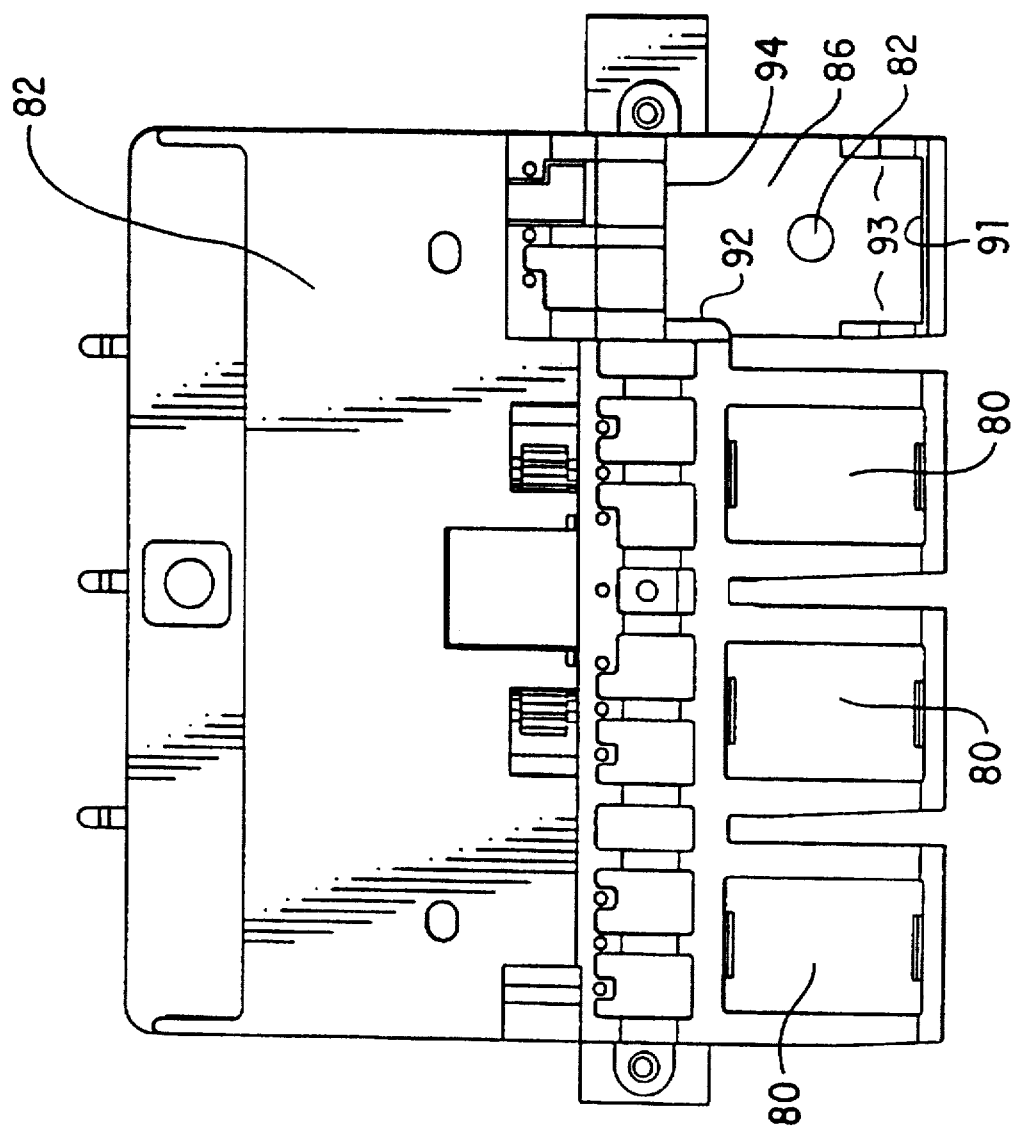
FIG. 11 is a front view of the flex-circuit frame of FIG. 10.

As best shown in FIGS. 9–11, a previously existing spring assembly may be used if desired to assure reliable interconnection for some of the individual color cartridges. The spring assembly may include a backing sheet 74, a plate 76 and a gimbal spring 78 are sized for fitting into apertures 80 of flex-circuit frame 82 to assure proper electrical interconnection for the three color cartridges. The unique resilient assembly of the present invention as implemented for the 600 dpi cartridge interconnect includes an unitary resilient foam member 84 which fits in a seat 86 which is larger than the aperture 80. A mounting peg 88 fits into matching hole 90 which along with bottom and lower ledges 91, 93 and upper side and top ledges 92, 94 hold the foam member in proper position to assure operative engagement across the electrical interconnect.

Figure 7:
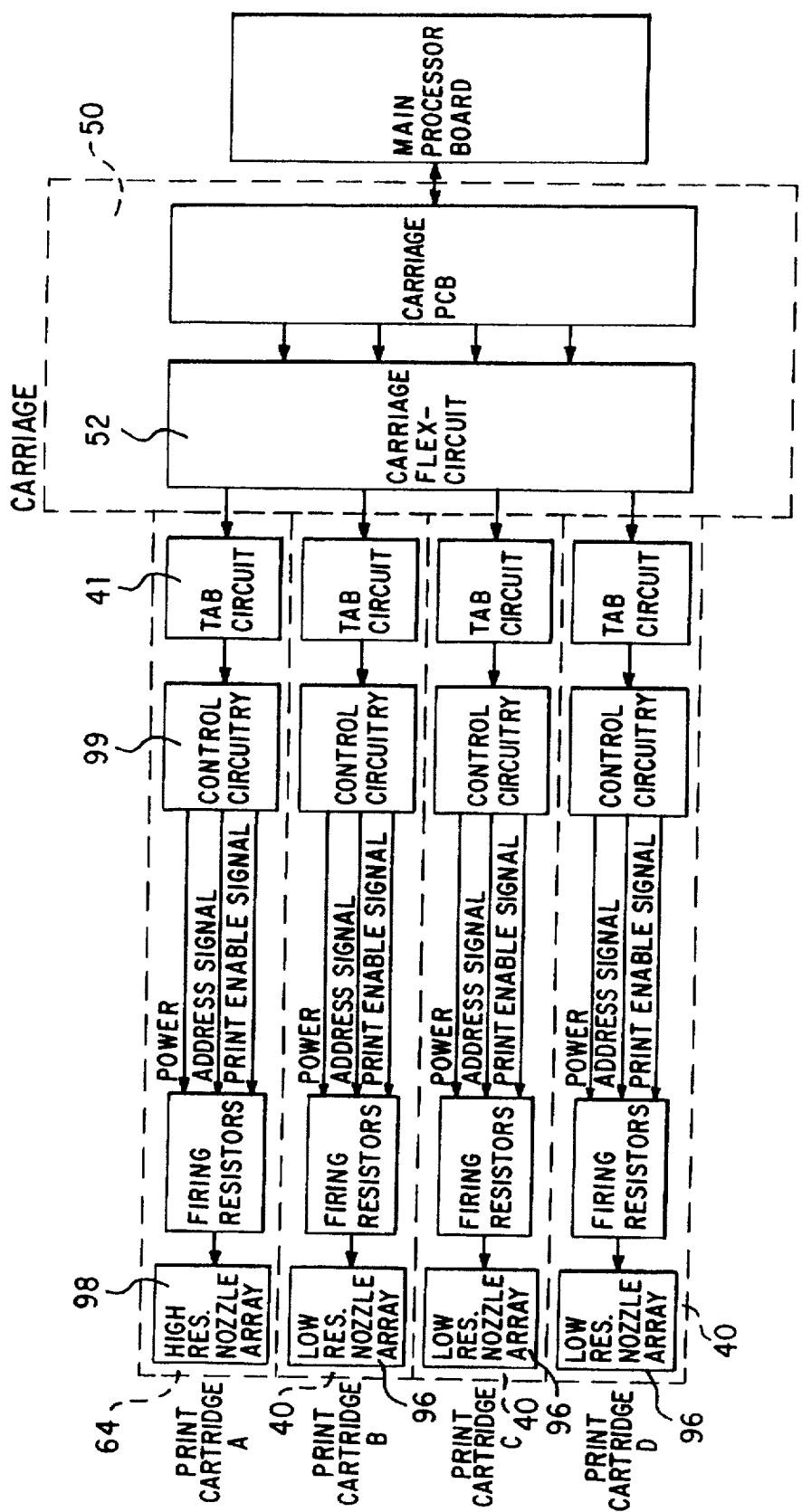
FIG. 7 is a schematic block diagram of the presently preferred printer embodiment incorporating the invention.
Figure 8:
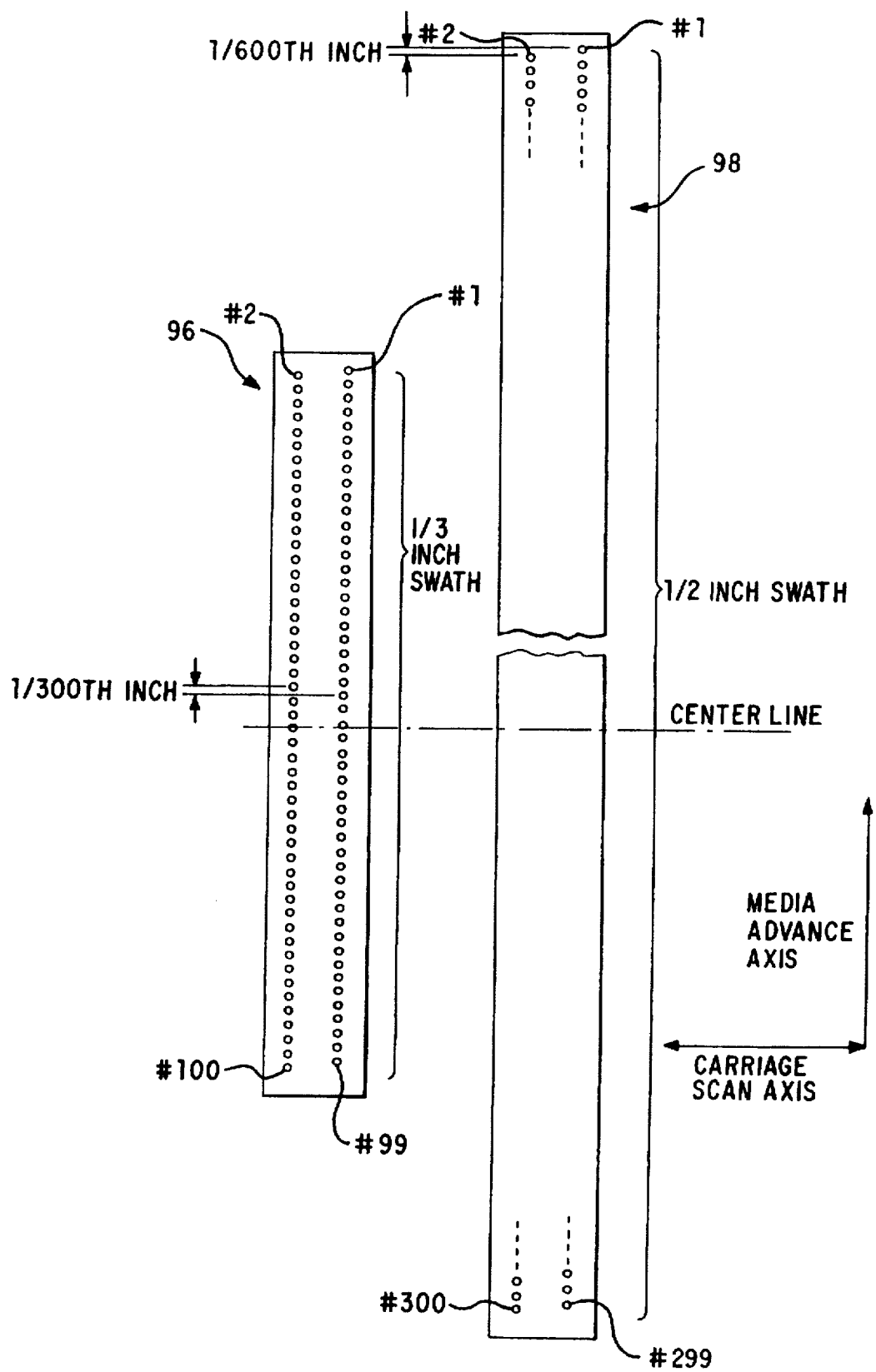
FIG. 8 is a schematic bottom view as seen looking up from the media showing the alignment relationship of the nozzle arrays of FIG. 7.

FIGS. 7–8 show the preferred mounting relationship between a 300 dpi nozzle array 96 of the color printheads and a 600 dpi nozzle array 98 of the black printhead. Control circuitry 99 on the substrate enables the three hundred firing resistors of the black printhead to be controlled by a multiplexing scheme through fifty-two electrical interconnect pads, and similarly enables all one hundred four firing resistors of each color printhead to be controlled by a multiplexing scheme through thirty-two electrical interconnect pads.

Figure 12:
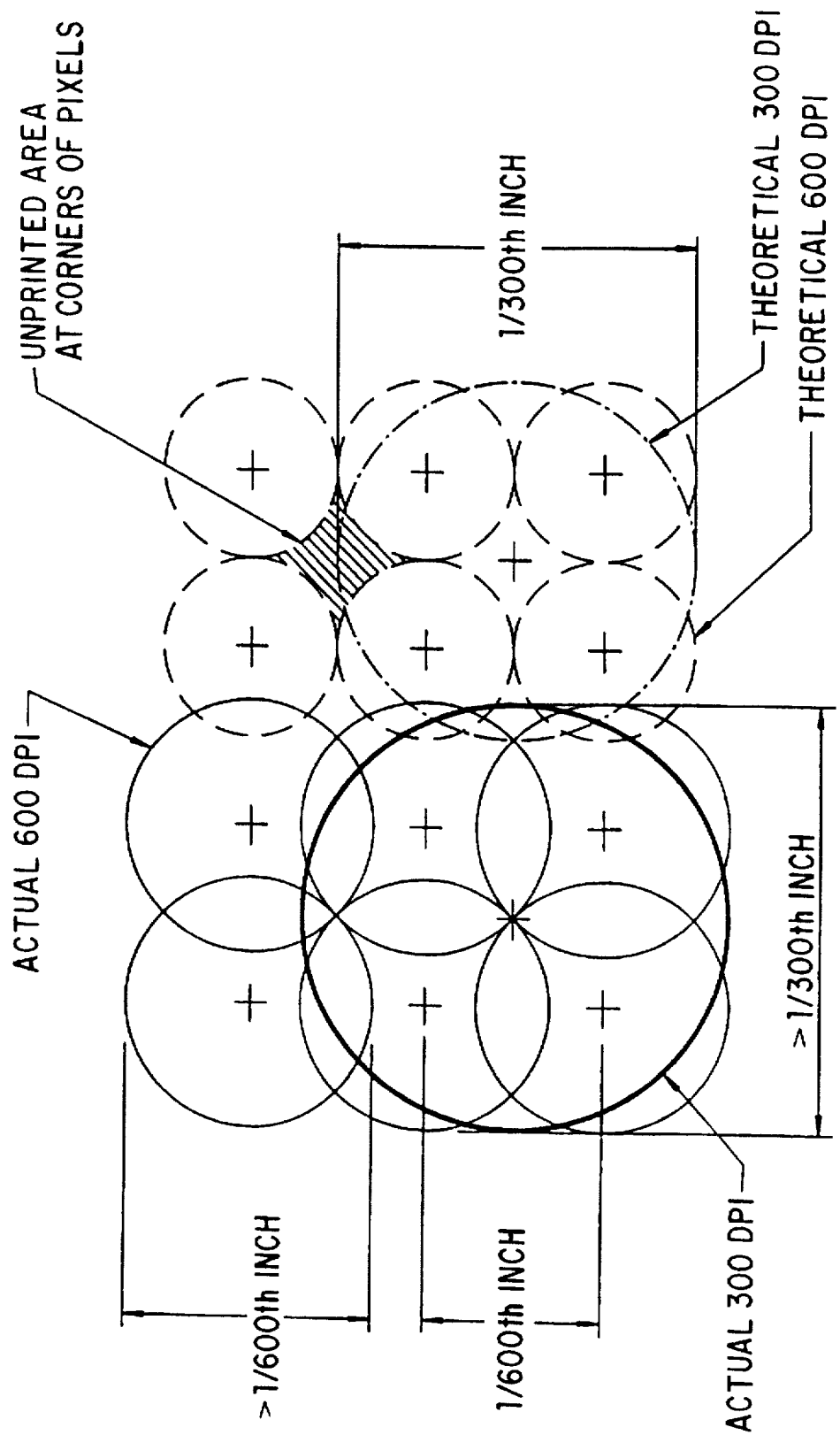
FIG. 12 is a schematic diagram showing the relative resolution between a 600 dpi printout of the black printheads and a 300 dpi printout of the color printheads of a presently preferred printer embodiment incorporating the invention.

FIG. 12 schematically shows the difference between the 300 dpi printout produced by the color pens (i.e., pen cartridges) and the 600 dpi printout of the black pen of the preferred embodiment described herein. Of course, it would be possible to incorporated different combinations of resolution in different printheads wherein the resolution difference may be arbitrary, depending on the printheads available and already developed, or wherein the resolution difference may be decimally related (e.g., 20% greater resolution, 30% greater resolution, etc.) or fractionally related (300 dpi with 400 dpi; 300 dpi with 450 dpi, etc.). In that regard, the invention can be implemented with any of the existing inkjet cartridges which are currently available, although the benefits are especially needed in interconnect arrays having multiple columns of densely packed pads which are close to each other as well as close to the edge of the flexible circuit member.

Figure 13:
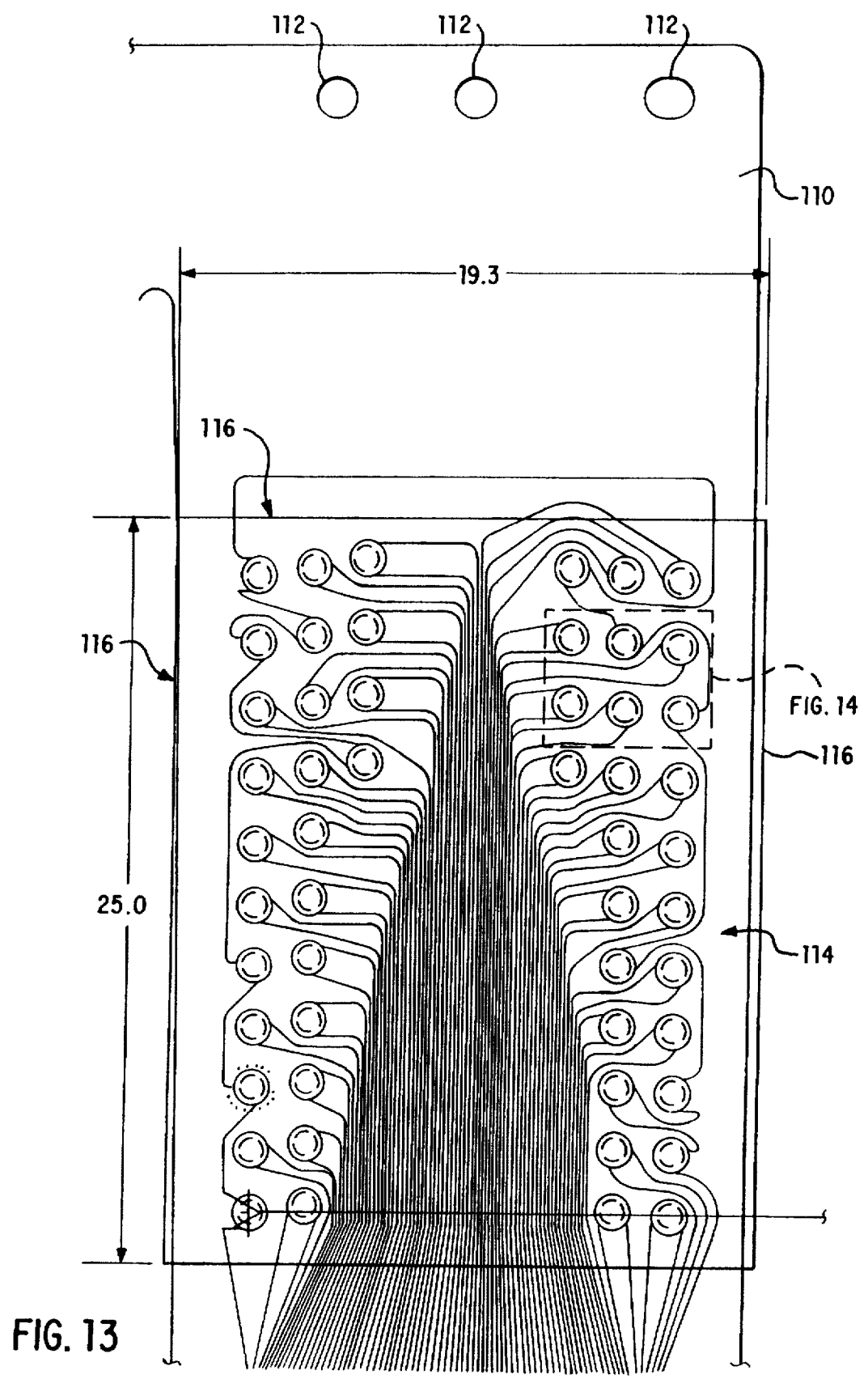
FIG. 13 is a top plan view of a six column array of interconnect domes overlying the compliant foam assembly of the present invention.
Figure 14:
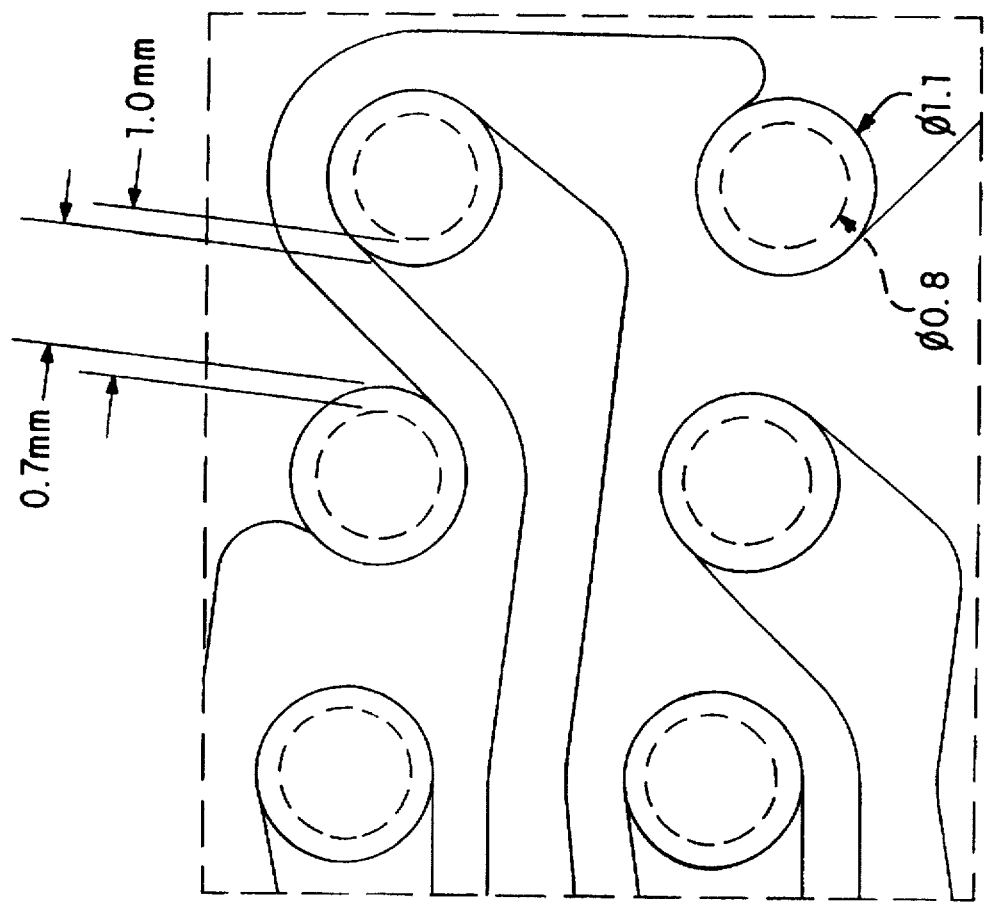
FIG. 14 is an enlarged close-up view of a portion of FIG. 13.
Figure 15:
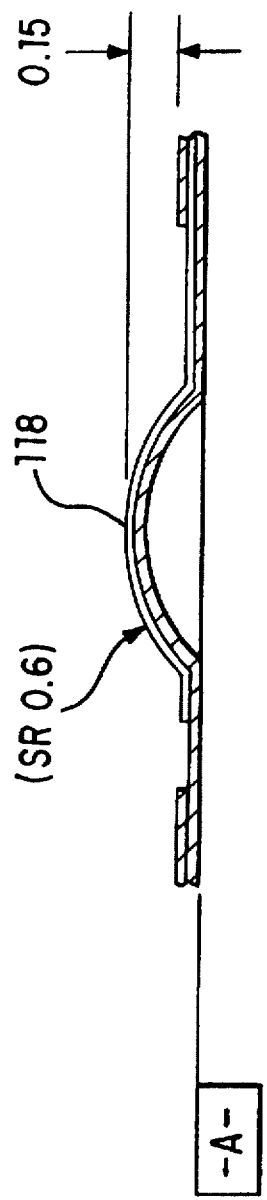
FIG. 15 is an enlarged sectional side view of a single interconnect dome of FIG. 14.

The actual layout and dimensions of a typical interconnect array is shown in FIGS. 13–15. A flexible circuit 110 includes apertures 112 for mounting on a carriage, with side boundaries of the interconnect portion 114 and an underlying compliant foam member 116 approximately coincident with each other. The width of the compliant foam member is approximately 19.3 mm with a length of approximately 25 mm. As shown in FIG. 14, the distance between typical adjacent metallic dome interconnects (preferably made of copper) i s approximately 0.7 mm at their peripheral base perimeters and approximately 1 mm at the rising dome perimeters. The actual diameter of the overall copper pad itself is approximately 1.1 mm, while the actual diameter of a rising dome portion is approximately 0.8 mm. As shown in FIG. 15, the apex 118 of a dome is approximately 0.15 mm above the top of the flexible circuit.

Figure 16:
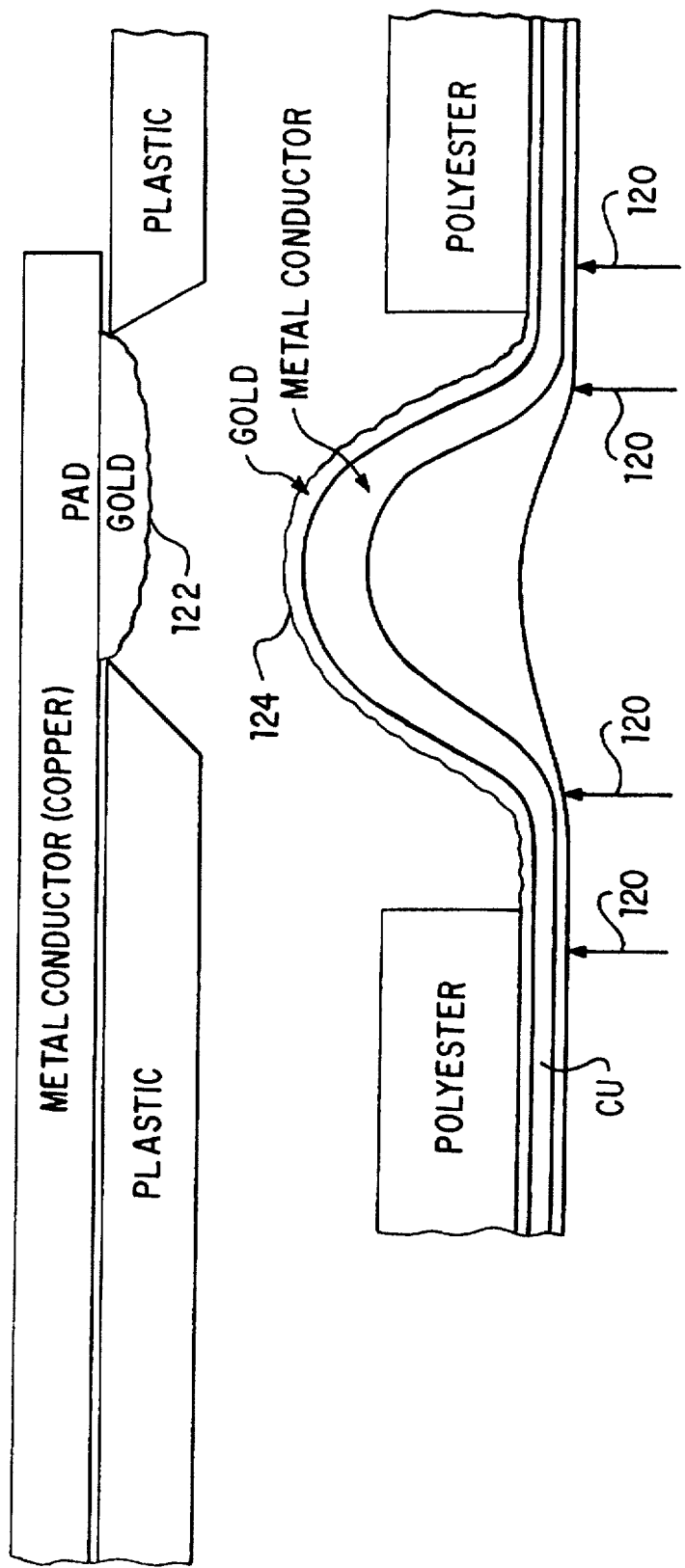
FIG. 16 is a schematic sectional view showing an interconnect dome of FIG. 13 about to make contact with an interconnect pad of a flexible circuit on a print cartridge.

The schematic diagram of FIG. 16 shows how the pressure exerted along arrows 120 against the peripheral base portion of the copper interconnect pads serves to push the semi-rigid dome into direct contact with an aligned relatively flat metallic pad on a flexible interconnect circuit for the printhead. Both interconnect surfaces 122, 124 are preferably coated with gold.

The compliant foam member 116 is pushed into a compressed state by contact of the carriage interconnect circuit 110 with the cartridge interconnect circuit. In one embodiment, the foam support member is compressed a distance within a range not to exceed two mm. In an alternate embodiment, the foam support member is compressed a distance within a range not to exceed one mm. In another embodiment, the foam support member is compressed such that a force within the range of 20–40 newtons is exerted by the compressed foam support member against the carriage interconnect circuit.

It will therefore be appreciated by those skilled in the art that the invention as shown and described herein can be implemented with different types of print cartridges such as cartridges of different print resolutions and/or differently sized print swaths, without having the problem of trying to align multiple interconnect support cylinders within the millimeter tolerances of a densely packed interconnect array. In that regard, any portion of the flat top surface of the unique compliant foam member will provide sufficient force to hold the gold interconnect surfaces in abutting electrical contact position.

The new type of compliant foam interconnect support disclosed herein allows for easy optimization and customization for the particular contact pattern of different cartridges in the same carriage by merely changing the perimeter size and shape of the foam block. If addition force is needed, a thicker and/or denser block can be chosen and calibrated to provide the desirable range of forces. Thus, the size of the carriage and the way that the cartridge is held in the carriage has to change very little between subsequent generations of printers. In other words, the required design change to the printer is minimized, the carriage does not have to grow wider nor taller, and the printer does not have to grow wider nor taller.

While specific illustrated embodiments have been shown and described, it will be appreciated by those skilled in the art that various modifications, changes and additions can be made to the methods, structures and apparatus of the invention without departing from the spirit and scope of the invention as set forth in the following claims.

We claim as our invention:

1. A printer/plotter with a carriage for removably mounting at least one inkjet print cartridge, comprising:
   a frame for holding media in a print zone;
   a carriage supported on said frame to be positioned adjacent to said print zone;
   a first compartment on said carriage for receiving a first print cartridge, said compartment having a compartment width dimension at least as large as a corresponding cartridge width dimension, said compartment having a flexible circuit with a plurality of interconnect pads on one surface of said flexible circuit for contacting matching printhead pads to transmit signals to said first print cartridge when said first print cartridge is mounted in said first compartment, said flexible circuit having a lateral extent which extends entirely across said compartment width dimension;
   a force applying assembly in said first compartment including a compliant foam member underlying said lateral extent of said flexible circuit and having a relatively flat upper surface to push against an underside of said flexible circuit to assure satisfactory operative engagement between said printhead pads and said interconnect pads when said first print cartridge is mounted in said first compartment; and
   wherein said compartment further including a cavity into which said compliant foam member is seated, said cavity defined by a plurality of upstanding walls for holding the compliant foam member in proper position to assure operative engagement of said interconnect pads with said printhead pads, said foam member having side edges engaged by said upstanding walls.

2. The printer/plotter of claim 1 wherein said interconnect pads transmit print activation signals to said first print cartridge.

3. The printer/plotter of claim 1 wherein said first print cartridge generates a component selected from a group consisting of cyan, magenta, yellow, red, green, blue and black.

4. The printer/plotter of claim 1 wherein said foam member constitutes a unitary foam block.

5. The printer/plotter of claim 1 wherein said first print cartridge generates a black color component.

6. The printer/plotter of claim 1 wherein said first print cartridge generates a color component selected from a group consisting of cyan, magenta and yellow.

7. The printer/plotter of claim 1 wherein said interconnect pads include an array of more than forty conductive pads.

8. The printer/plotter of claim 1 wherein said interconnect pads include an array of more than fifty conductive pads.

9. The printer/plotter of claim 1 wherein said interconnect pads include an array of at least two columns of conductive pads.

10. The printer/plotter of claim 1 wherein said interconnect pads include an array of at least four columns of conductive pads.

11. The printer/plotter of claim 1 wherein said interconnect pads include an array of at least six columns of conductive pads.

12. The printer/plotter of claim 1 wherein said interconnect pads are dome-shaped.

13. The printer/plotter of claim 12 wherein said compliant foam member pushes against a peripheral base portion of said dome-shaped pads.

14. The printer/plotter of claim 13 wherein said dome-shaped pads are formed of a conductive metallic material.

15. The printer/plotter of claim 13 wherein said first print cartridge includes a printhead having said printhead pads on a flexible circuit member.

16. The printer/plotter of claim 1 wherein said plurality of upstanding walls includes bottom and lower side ledges and upper side and top ledges.

17. The printer/plotter of claim 1 wherein said printhead pads are each connected to multiple printhead firing resistors of the printhead to be controlled by a multiplexing scheme so that multiple printheads are controlled by a single pad, and said interconnect pads include a densely packed array of more than fifty conductive pads.

18. A printer/plotter mounting system comprising:
   a frame for holding media in a print zone;
   a carriage supported on said frame to be positioned adjacent to said print zone;

a first print cartridge including a high resolution printhead and at least fifty densely packed printhead pads connected to firing resistors comprising said printhead for controlling activation of said resistors;

a first compartment on said carriage for receiving said first print cartridge, said compartment having a width dimension at least as large as a corresponding cartridge width dimension, said compartment having a flexible circuit with at least fifty densely packed interconnect pads on one surface of said flexible circuit for contacting matching ones of said printhead pads to transmit signals to said first print cartridge when said first print cartridge is mounted in said first cartridge, said flexible circuit having a lateral extent which extends across said entire compartment width dimension;

a force applying assembly in said first compartment including a compliant foam member underlying said lateral extent of said flexible circuit and having a relatively flat upper surface to push against an underside of said flexible circuit to assure satisfactory operative engagement between said printhead pads and said interconnect pads when said first print cartridge is mounted in said first cartridge; and wherein said compartment further including a cavity into which said compliant foam member is seated, said cavity defined by a plurality of upstanding walls for holding the compliant foam member in proper position to assure operative engagement of said interconnect pads with said printhead pads, said foam member having side edges engaged by said upstanding walls.

19. The printer/plotter of claim 18 wherein said interconnect pads are dome-shaped and wherein said compliant foam member pushes against a peripheral base portion of said dome-shaped pads.

20. A method of mounting an inkjet cartridge having a first electrical interconnect array in a print carriage having a second electrical interconnect array, comprising the steps of:

positioning a compliant foam support member in its normal expanded state in a cavity formed in the carriage behind the second array, said second array and said foam support member extending entirely across a lateral dimension of said cavity, said cavity defined by a plurality of upstanding walls for holding the compliant foam support member in proper position to assure operative engagement of said second array with said second array, said foam member having side edges engaged by said upstanding walls said positioning step occurring prior to initiating any printing; and inserting the inkjet cartridge into the carriage in order to bring the first array into contacting alignment with the second array while at the same time pushing said compliant foam support member into a compressed state, thereby assuring conductivity between the first and second array.

21. The method of claim 20, wherein said pushing step includes pushing the entire compliant form support member into a compressed state.

22. The method of claim 20, wherein said pushing step includes compressing the compliant foam support member a distance within a range not to exceed two mm.

23. The method of claim 20, wherein said pushing step includes compressing the compliant foam support member a distance within a range not to exceed one mm.

24. The method of claim 20, wherein said pushing step includes compressing the compliant foam support member such that a force within the range of 20–40 newtons is exerted by the compressed foam support member against the first array.

* * * * *

UNITED STATES PATENT AND TRADEMARK OFFICE
CERTIFICATE OF CORRECTION

PATENT NO. : 5,796,417
DATED : August 18, 1998
INVENTOR(S) : Gary M. Nobel

It is certified that error appears in the above-identified patent and that said Letters Patent is hereby corrected as shown below:

At Column 6, line 61, delete "printheads" and insert in lieu thereof --printhead firing resistors of the printhead--.

Signed and Sealed this

Nineteenth Day of January, 1999

Attest:

*Acting Commissioner of Patents and Trademarks*

Attesting Officer